(12) United States Patent
Zhu et al.

(10) Patent No.: US 10,748,800 B2
(45) Date of Patent: Aug. 18, 2020

(54) CHIP BONDING APPARATUS AND METHOD

(71) Applicant: SHANGHAI MICRO ELECTRONICS EQUIPMENT (GROUP) CO., LTD., Shanghai (CN)

(72) Inventors: Yuebin Zhu, Shanghai (CN); Feibiao Chen, Shanghai (CN); Hai Xia, Shanghai (CN); Bin Yu, Shanghai (CN); Song Guo, Shanghai (CN); Yaping Ge, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 66 days.

(21) Appl. No.: 16/080,376

(22) PCT Filed: Feb. 27, 2017

(86) PCT No.: PCT/CN2017/075027
§ 371 (c)(1),
(2) Date: Aug. 28, 2018

(87) PCT Pub. No.: WO2017/148352
PCT Pub. Date: Sep. 8, 2017

(65) Prior Publication Data
US 2019/0088516 A1    Mar. 21, 2019

(30) Foreign Application Priority Data

Feb. 29, 2016  (CN) .......................... 2016 1 0113368

(51) Int. Cl.
*H01L 21/68*    (2006.01)
*H01L 21/67*    (2006.01)
(Continued)

(52) U.S. Cl.
CPC ............ *H01L 21/681* (2013.01); *H01L 21/67* (2013.01); *H01L 21/67144* (2013.01);
(Continued)

(58) Field of Classification Search
CPC .................................................... H01L 21/681
See application file for complete search history.

(56) References Cited

U.S. PATENT DOCUMENTS

| 9,570,417 B2 * | 2/2017 | Jeong ...................... H01L 24/83 |
| 2016/0126218 A1 * | 5/2016 | Kurita ..................... H01L 24/83 |
| | | 438/113 |

FOREIGN PATENT DOCUMENTS

| CN | 201522998 U | 7/2010 |
| CN | 103367208 A | 10/2013 |

(Continued)

*Primary Examiner* — Yu-Hsi D Sun
(74) *Attorney, Agent, or Firm* — Muncy, Geissler, Olds & Lowe, PC (57) ABSTRACT

A chip bonding device is disclosed, including a first motion stage (110), a second motion stage (200), a chip pickup element (160), a transfer carrier (170), a chip adjustment system (1000), a bonding stage (420) and a control system (500). A chip bonding method is also disclosed, in which a set of chips are temporarily retained on the transfer carrier (170) and their positions on the transfer carrier (170) are accurately adjusted by using the chip adjustment system (1000), followed by bonding the chips on the transfer carrier (170) simultaneously onto the substrate (430). With this batch bonding approach, flip-chips can be bonded with greatly enhanced efficiency. Moreover, picking up and bonding chips in batches can balance times for chip picking up, fine chip position tuning and chip bonding, thereby ensuring high bonding accuracy while increasing the throughput.

17 Claims, 4 Drawing Sheets

(51) Int. Cl.
  *H01L 21/683* (2006.01)
  *H01L 23/00* (2006.01)
  *H01L 21/687* (2006.01)
(52) U.S. Cl.
  CPC ...... *H01L 21/67265* (2013.01); *H01L 21/683* (2013.01); *H01L 24/74* (2013.01); *H01L 24/95* (2013.01); *H01L 21/6835* (2013.01); *H01L 21/6838* (2013.01); *H01L 21/68742* (2013.01)

(56) References Cited

FOREIGN PATENT DOCUMENTS

JP  200016460 A   6/2000
KR  101456138 B1  11/2014

\* cited by examiner

| The first motion stage transports a set of chips to the chip pickup means and the second motion stage moves the transfer carrier to the chip pickup means |

| The chip pickup means pick up the chips from the first motion stage and cause their temporary retention on the transfer carrier |

| The second motion stage transports the transfer carrier on which the chips are temporarily retained to the chip adjustment system |

| The chip adjustment system adjusts the positions of the chips on the transfer carrier |

| The second motion stage transports the transfer carrier retaining the position-adjusted chips to a substrate |

| The bonding stage that supports the substrate causes final bonding of the substrate to the chips on the transfer carrier |

Fig. 9

CHIP BONDING APPARATUS AND METHOD

TECHNICAL FIELD

The present invention relates to the field of chip packaging techniques and, in particular, to a chip bonding device and method.

BACKGROUND

With the development of science and technology, electronic products are becoming increasingly light, slim and compact. Flip-chip bonding technology is widely used in chip packaging applications because of a wide range of advantages such as a small package footprint and shortened signal transmission path.

Figure 1:
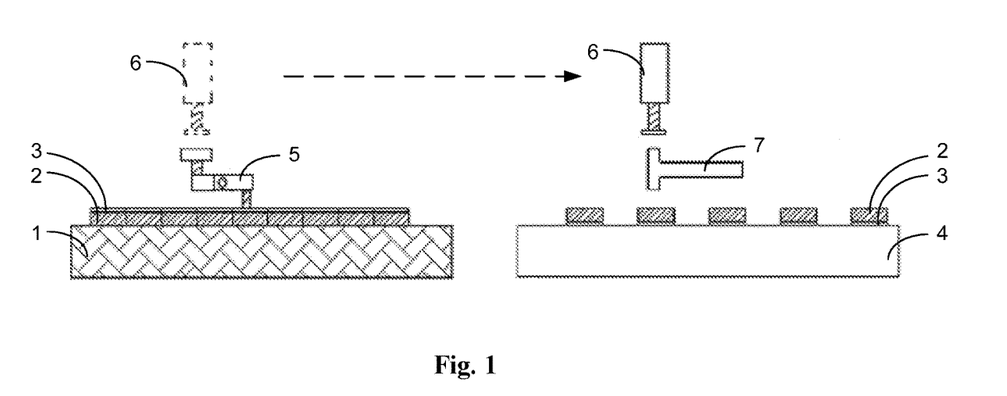
FIG. 1 schematically illustrates a chip bonding process performed by a conventional flip-chip bonding device.

FIG. 1 schematically illustrates a chip bonding process performed by a conventional flip-chip bonding device. As shown in FIG. 1, the conventional process essentially includes the steps of: providing a substrate 4 and a chip 2 to be bonded to the substrate, the chip 2 having a component side 3; placing the chip 2 on a support stage 1, with the component side 3 facing upward; picking up and flipping over the chip 2 by a first robotic arm 5; handing the chip 2 over to a second robotic arm 6 from the first robotic arm 5; moving the chip 2 to above the substrate 4 by the second robotic arm 6 and aligning an alignment mark on the chip 2 with an alignment mark on the substrate 4 with the aid of a CCD image sensor 7; pressing the chip 2 down onto, and hence bonding it to, the substrate by the second robotic arm 6.

In the above flip-chip bonding process, the chip 2 is first flipped over and then the chip 2 is directly bonded onto the substrate 4 by the flip-chip bonding device so as to establish an interconnection between the chip 2 and the substrate 4. However, as the process is performed in a serial manner in which the conventional flip-chip bonding device can bond only one chip in each press cycle (about 30 seconds), the throughout is very low and unable to address mass production.

Therefore, there is an urgent need in this art for a solution for the problem of a low throughput of the conventional flip-chip bonding device that does not allow mass production.

SUMMARY OF THE INVENTION

The present invention solves the above-described problem with the conventional technique by presenting a chip bonding device, including a first motion stage, a second motion stage, a chip pickup element, a transfer carrier, a chip adjustment system, a bonding stage and a control system.

The first motion stage is configured to support a set of chips and transport the set of chips to the chip pickup element.

The transfer carrier is configured for temporary retention of the chips picked up by the chip pickup element from the first motion stage.

The chip adjustment system is configured to adjust positions of the chips on the transfer carrier.

The bonding stage is configured to support a substrate.

The second motion stage is configured to transport the transfer carrier to the chip pickup element, and further transport the chip pickup element having the chips temporarily retained thereon to the chip adjustment system, and further transport the chip pickup element having the position-adjusted chips retained thereon to the substrate, so as to finally bond the substrate to the chips on the transfer carrier; and wherein each of the first motion stage, the second motion stage, the chip adjustment system and the bonding stage is controlled by the control system and movable in multiple degrees of freedom.

Optionally, the chip bonding device may further include a calibration system, wherein the chips are provided with chip marks and the substrate with substrate marks, wherein the calibration system is configured to detect the chip marks and the substrate marks, and wherein the control system is configured to adjust a position of the bonding stage based on the detection by the calibration system so that the chip mark are aligned with the substrate marks.

Optionally, the chip pickup element may include a flipping arm configured to pick up the chips from the first motion stage, flip the chips and achieve the temporary retention of the chips on the transfer carrier.

Optionally, the flipping arm may include: a first motion mechanism; a motor for driving the first motion mechanism to flip the chips; a connecting member that connects the motor to the first motion mechanism; and a first suction cup connected to the first motion mechanism and configured to retain a target chip by suction.

Optionally, the bonding stage may be disposed under the substrate and configured to move the substrate upward so as to bond the substrate to the chips on the transfer carrier.

Optionally, the chip adjustment system may include an alignment system and a fine tuning system, which are configured to measure and adjust the positions of the chips on the transfer carrier.

Optionally, the fine tuning system may include: a second motion mechanism; a second suction cup connected to the second motion mechanism and configured to retain a target chip by suction; and a support mechanism configured to support the second motion mechanism, and wherein during an adjustment of a position of the target chip on the transfer carrier by the chip adjustment system, the target chip on the transfer carrier is sucked by the second suction cup, and after the transfer carrier is moved to a position suitable for temporary retention of the target chip by the second motion stage based on a measurement performed by the alignment system, the target chip is transferred again to the transfer carrier by the second suction cup.

Optionally, after the target chip is transferred again to the transfer carrier by the second suction cup, the second motion stage delivers the transfer carrier into an alignment measuring region for the alignment system for position verification, and if the alignment system determines that the target chip is not positioned at a predetermined position, the position of the target chip on the transfer carrier is repeatedly adjusted until the target chip is positioned at the predetermined position.

Optionally, the alignment system may include a broadband light source, an illumination lens group, a beam splitting prism, a front imaging lens group, a rear imaging lens group and an image sensor, wherein a measuring light beam from the broadband light source propagates successively through the illumination lens group, the beam splitting prism and the front imaging lens group and is incident onto a chip mark of a target chip, and the reflected beam from the chip mark propagates successively through the front imaging lens group, the beam splitting prism and the rear imaging lens group and forms an image of the chip mark on the image sensor, followed by outputting of an image by the image sensor, which is processed to determine the position of the target chip on the transfer carrier.

Optionally, the chip bonding device may further include a jack mechanism that is connected to the first motion stage and configured to lift the chips so that the chip pickup element is able to pick up the chips from the first motion stage.

Optionally, the jack mechanism may include: a pin; a suction retainer; and a horizontal motion mechanism attached to a bottom of the suction retainer, the suction retainer configured for retention of the chip by suction, the pin configured to lift the chips, the horizontal motion mechanism configured to horizontally transport the pin and the suction retainer to move the pin to a predetermined position.

Optionally, the chip bonding device may further include a carrier cassette and a first robotic arm, the carrier cassette disposed in vicinity of the first motion stage and configured to hold a support carrier that carries the set of chips, the first robotic arm configured to, under the control of the control system, pick up the support carrier and transport the support carrier to the first motion stage.

Optionally, the chip bonding device may further include a substrate cassette and a second robotic arm, the substrate cassette disposed in vicinity of the bonding stage and configured to store the substrate that have undergone the chip bonding, the second robotic arm configured to, under the control of the control system, pick up the substrate and place the substrate into the substrate cassette.

The present invention also provides a chip bonding method, including the steps of:

transporting a set of chips to a chip pickup element by a first motion stage and moving a transfer carrier to the chip pickup element by a second motion stage;

picking up the chips from the first motion stage and temporarily retaining the chips on the transfer carrier by the chip pickup element;

transporting the transfer carrier on which the chips are temporarily retained to a chip adjustment system by the second motion stage;

adjusting positions of the chips on the transfer carrier by the chip adjustment system;

transporting the transfer carrier retaining the position-adjusted chips to a substrate by the second motion stage; and finally bonding the substrate to the chips on the transfer carrier by the bonding stage that supports the substrate.

Optionally, the chip bonding method may further include, prior to transporting the set of chips to the chip pickup element by the first motion stage, picking up a support carrier on which the set of chips are carried from the carrier cassette and placing the support carrier on the first motion stage by a first robotic arm.

Optionally, the chip bonding method may further include repeating the steps until all of the chips on the support carrier are bonded to the substrate.

Optionally, the chip bonding method may further include, subsequent to the final bonding of the substrate to the chips on the transfer carrier, picking up the substrate to which the chips have been bonded and placing the substrate into a substrate cassette by a second robotic arm.

The chip bonding device and method of the present invention allow greatly improved flip-chip bonding efficiency by bonding chips in batches onto the substrate using the transfer carrier capable of temporary retention of the chips and the chip adjustment system capable of accurate chip position adjustment for the transfer carrier. Picking up and bonding chips in batches according to the present invention balances the times required respectively for chip picking up, fine chip position tuning and chip bonding, thereby ensuring high bonding accuracy of the bonding device while increasing the throughput.

DETAILED DESCRIPTION OF PREFERRED EMBODIMENTS

The present invention will be described below in further detail with reference to the accompanying drawings and a few specific embodiments. Features and advantages of the invention will be more apparent from the following detailed description, and from the appended claims. It is noted that the figures are provided in a very simplified form not necessarily presented to scale, with the only intention to facilitate convenience and clarity in explaining some embodiments of the present invention.

Figure 2:
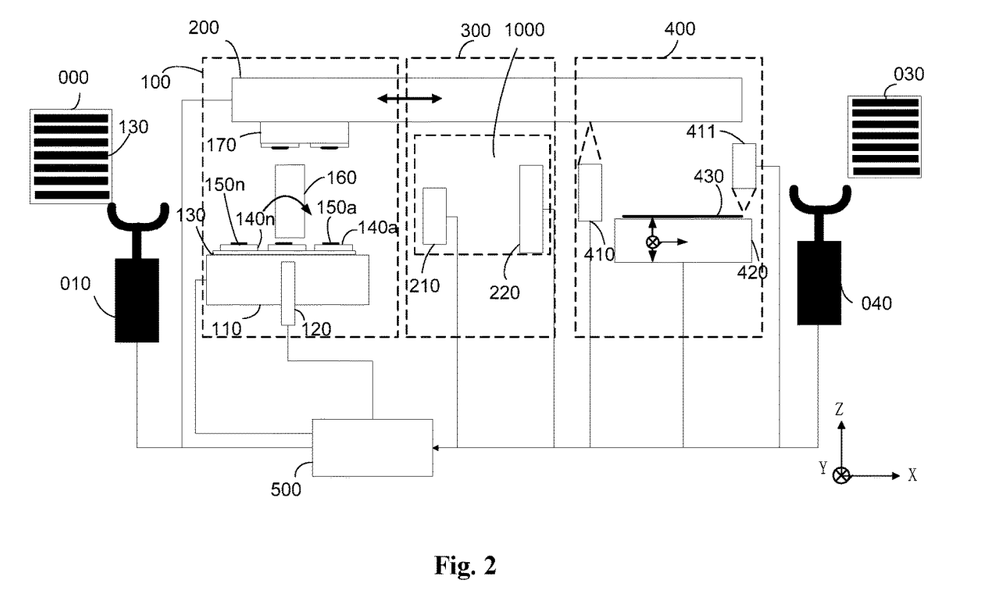
FIGS. 2 to 4 schematically illustrate configurations in different steps of a chip bonding method according to an embodiment of the present invention.

FIG. 2 shows a chip bonding device according to the present invention, which includes a first motion stage 110, a second motion stage 200, a chip pickup element 160, a transfer carrier 170, a chip adjustment system 1000, a bonding stage 420 and a control system 500.

The first motion stage 110 is configured to support a set of chips 140a-140n and transport the chips to the chip pickup element 160.

The transfer carrier 170 is configured for temporary retention of the chips picked up by the chip pickup element 160 from the first motion stage 110.

The chip adjustment system 1000 is configured to adjust the positions of the chips on the transfer carrier 170.

The bonding stage 420 is configured to support a substrate 430 and cause the substrate 430 to be finally bonded to the chips on the transfer carrier 170.

The second motion stage 200 is configured to move the transfer carrier 170 to the chip pickup element 160 for temporary retention of the chips, and then move the transfer carrier 170 to the chip adjustment system 1000 for position adjustment of the chips, and finally move the transfer carrier 170 to the substrate 430.

The first motion stage 110, the second motion stage 200, the chip adjustment system 1000 and the bonding stage 420 are under unified control of the control system 500 and movable in multiple degrees of freedom.

With continued reference to FIG. 2, in this embodiment, the chip bonding device may further include a carrier cassette 000 and a first robotic arm 010. The carrier cassette 000 is disposed in the vicinity of the first motion stage 110 and is configured to hold support carriers 130 each carrying a set of chips to be bonded. The first robotic arm 010 is configures to, under the control of the control system 500, pick up a support carrier 130 and place it on the first motion stage 110. The chip bonding device may further include a substrate cassette 030 and a second robotic arm 040. The substrate cassette 030 is disposed in the vicinity of the bonding stage 420 and is configured to store substrates that have undergone chip bonding. The second robotic arm 040 is configured to, under the control of the control system 500, pick up the substrate 430 and place it into the substrate cassette 030. This embodiment is described with a set of target chips 140a, . . . , 140n as an example, each of which is associated with a respective mark 150a, . . . , 150n disposed above it. According to this embodiment, the bonding stage 420 is disposed under the substrate 430 and the bonding stage 420 is configured to move the substrate 430 upward so as to allow it to be bonded to the chips on the transfer carrier 170.

In this embodiment, the chip pickup element may be implemented as a flipping arm 160 configured to pick up a chip from the first motion stage 110, flip it and then cause temporary retention of flipped chip on the transfer carrier 170.

Figure 5:
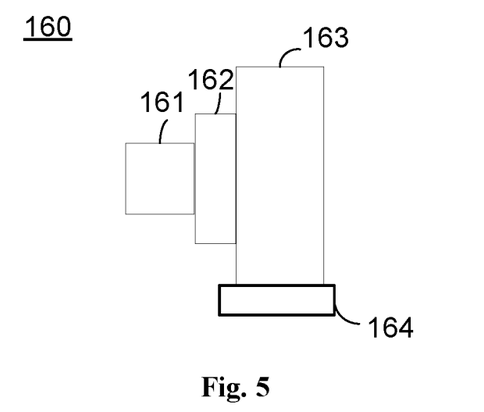
FIG. 5 is a structural schematic of a flipping arm in a chip bonding device according to an embodiment of the present invention.

As shown in detail in FIG. 5, the flipping arm 160 may include: a first motion mechanism 163; a motor 161 for driving the first motion mechanism 163 to flip a chip; a connecting member 162 that connects the motor 161 to the first motion mechanism 163; and a first suction cup 164 connected to the first motion mechanism 163 and configured to retain a target chip by suction.

In this embodiment, the first motion mechanism 163 may be configured to be moveable in the Z-direction. Additionally, the suction cup 164 may be mounted at the bottom of the motion mechanism 163. The control system 500 may dictate the first motion mechanism 163 to move down to a predetermined position above a target chip, followed by lifting of the target chip by a jack mechanism 120, so that the suction cup 164 picks the target chip up. The first motion mechanism 163 may then move upward to a predetermined position where the motor 161 drives the first motion mechanism 163, along with the suction cup 164, to turn by 180°. At this point, the mark previously above the target chip is now under the target chip. In a preferred embodiment, the suction cup 164 may a rubber suction cup, a ceramic suction cup or any other suction cup that can pick up and retain the target chip by suction.

In this embodiment, the chip bonding device may further include the jack mechanism 120. The jack mechanism 120 is connected to the first motion stage 110 and is configured to lift a chip up so that the chip pickup element 160 can pick it up from the first motion stage 110.

Figure 6:
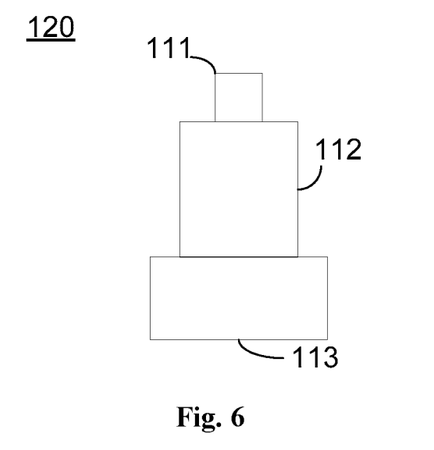
FIG. 6 is a structural schematic of a jack mechanism in a chip bonding device according to an embodiment of the present invention.

As shown in FIG. 6, according to the present invention, the jack mechanism 120 may include a pin 111, a suction retainer 112 and a horizontal motion mechanism attached to the bottom of the suction retainer. The suction retainer 112 is configured for retention of a chip by suction, and the pin 111 is configured to lift the target chip up. The horizontal motion mechanism 113 is horizontally movable so as to place the pin 111 at a position suitable for the handling of the target chip. In this embodiment, the pin 111 and the suction retainer 112 are both fixed on the horizontal motion mechanism 113 and hence can move synchronously with the horizontal motion mechanism 113 in the Y-direction. The suction retainer 112 can retain a support carrier by vacuum, and the pin 111 can lift up a target chip so that the flipping arm 160 can pick the chip up. The horizontal motion mechanism 113 is configured to move in the Y-direction so as to place the pin 111 at a position suitable for the handling of another target chip.

As shown in FIG. 2, according to the present invention, the chip adjustment system 1000 may include an alignment system 210 and a fine tuning system 220, which are configured to measure and adjust the position of a chip on the transfer carrier 170.

Figure 7:
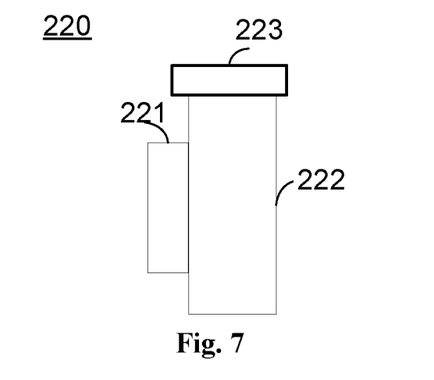
FIG. 7 is a structural schematic of a fine tuning system in a chip bonding device according to an embodiment of the present invention.

Specifically, as shown in FIG. 7, the fine tuning system 220 may include a second motion mechanism 222, a second suction cup 223 connected to the second motion mechanism 222 and configured to retain a target chip by suction and a support mechanism 221 for supporting the second motion mechanism 222. A process to adjust the position of a chip on the transfer carrier 170 by the chip adjustment system 1000 may include: picking up by suction the target chip on the transfer carrier 170 by the second suction cup 223; displacing the transfer carrier 170 to a position suitable for temporary retention of the target chip by the second motion stage 200 based on a measurement of the alignment system 210; and placing the target chip back onto the transfer carrier 170 by the second suction cup 223. After that, the second motion stage 200 delivers the transfer carrier 170 to an alignment measuring region for the alignment system 210 for position verification. If the alignment system 210 determines that the target chip is not positioned at the intended position, the process of adjusting the position of a chip on the transfer carrier 170 is repeated until the target chip is adjusted to the intended position.

Figure 8:
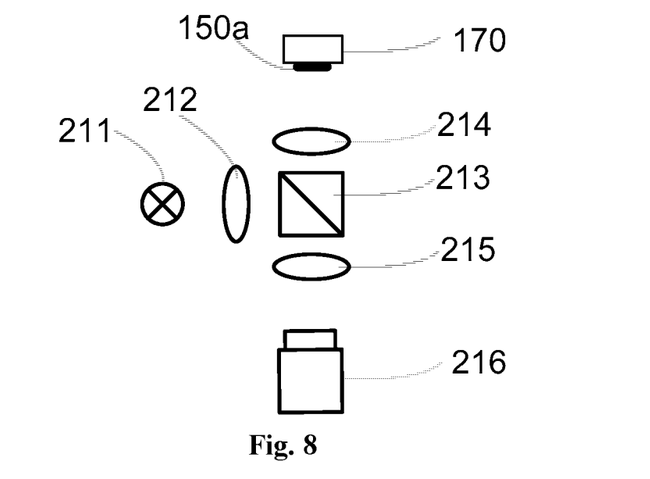
FIG. 8 is a structural schematic of an alignment system in a chip bonding device according to an embodiment of the present invention.

As shown in FIG. 8, the alignment system 210 may include a broadband light source 211, an illumination lens group 212, a beam splitting prism 213, a front imaging lens group 214, rear imaging lens group 215 and an image sensor 216.

A measuring light beam from the broadband light source 211 propagates successively through the illumination lens group 212, the beam splitting prism 213 and the front imaging lens group 214 and is incident onto the mark 150a of the target chip 170. The reflected beam from the mark 150a of the target chip 170 propagates successively through the front imaging lens group 214, the beam splitting prism 213 and the rear imaging lens group 215 and forms an image of the mark 150a on the image sensor 216. An image output from the image sensor 216 is processed to determine the position of the chip 170 on the transfer carrier 170, i.e., the aligned position for the mark 150a. According to the present invention, the alignment system 210 may employ a typical machine vision based alignment measuring technique.

As shown in FIG. 2, in this embodiment, the chip bonding device may further include a calibration system. Each chip may be provided with a respective chip mark, and each substrate 430 may be provided with substrate marks. The calibration system is configured to detect the chip and substrate marks in order to the guide the control system 500 to adjust the position of the bonding stage 420 so as to alignment the chip marks with the substrate marks before the bonding. In particular, the calibration system may include a first calibration system 410 for measuring the position of the transfer carrier 170 and a second calibration system 411 for measuring the position of the substrate 430. The calibration systems 410 and 411 may both be implemented as the alignment system of FIG. 8, and the present invention is not limited in this regard.

Preferably, the transfer carrier 170 for temporary retention may have a size that is smaller than that of the substrate 430 in order to achieve improved process adaptability, and the size of the transfer carrier 170 may be adjusted according to the actual chip sizes. By functionality, the chip bonding device may be divided into a separation section 100, an alignment/fine tuning section 300 and a bonding section 400. The separation section 100 is configured to separate target chips in batches and may include the motion stage 110, the jack mechanism 120 and the flipping arm 160. The alignment/fine tuning section 300 is configured for measuring alignment and fine-tuning alignment of target chips and may include the alignment system 210 and the fine tuning mechanism 220. The bonding section 400 is configured for bonding of target chips to substrate 430 and may include the calibration systems 410, 411 and the bonding stage 420.

In this embodiment, the alignment system 210 is disposed under the transfer carrier 170, the calibration system 410 is disposed under the transfer carrier 170, and the calibration system 411 is disposed above the substrate 430. In other words, the alignment system 210 and the calibration system 410 measure the positions of the marks above them, the calibration system 411 measures the positions of the marks under it. According to the present invention, the substrate 430 is provided with marks for alignment and measurement.

According to the present invention, the control system 500 may centrally control the movement in multiple degrees of freedom of the first motion stage 110, the second motion stage 200, the chip pickup element (flipping arm) 160 and the bonding stage 420. The mark 150n for alignment is located above the target chip 140n. Under the control of the control system 500, the second robotic arm 040 can pick up and transfer a support carrier 430. Under the control of the control system 500, the first motion stage 110 for supporting target chips is movable in the X- and Y-directions. Under the control of the control system 500, the flipping arm 160 is movable in the Z-direction, and the second motion stage 200 is movable in the X-direction. Under the control of the control system 500, the alignment system 210 can perform a position measurement. Under the control of the control system 500, the calibration system 410 can measure the position of the transfer carrier 170. Under the control of the control system 500, the bonding stage 420 is movable in the X-, Y-, Z- and Rz-directions. Under the control of the control system, the second robotic arm 040 can pick up and transfer a substrate. In a preferred embodiment, the substrate 430 is made of a metallic, semiconductor or organic material.

Figure 9:
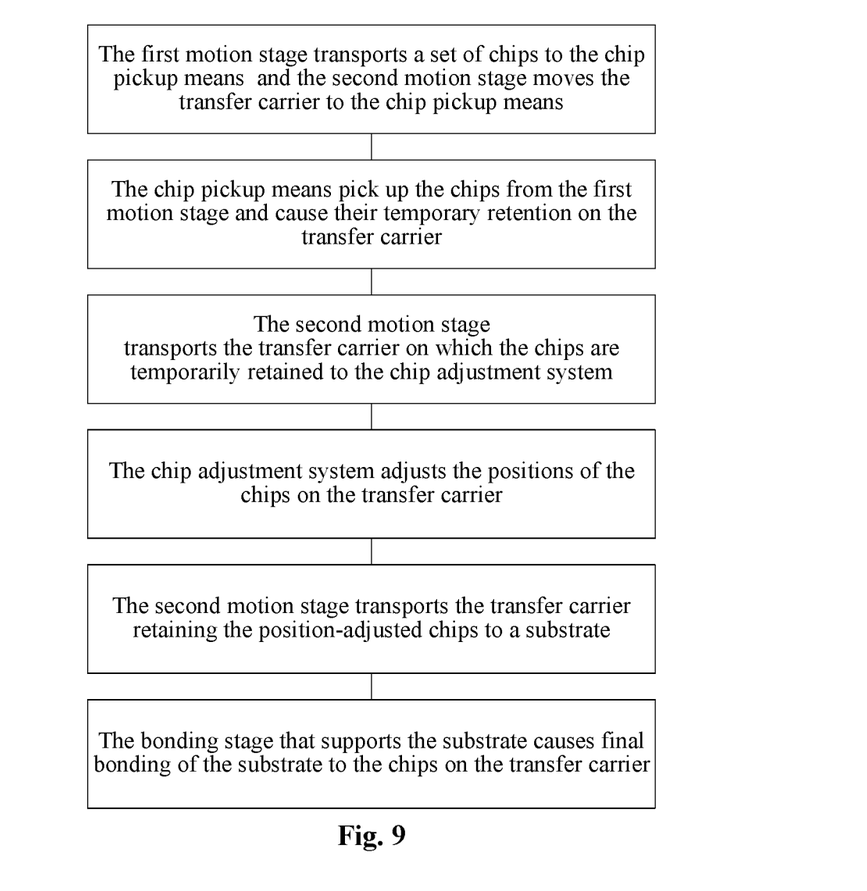
FIG. 9 is a flowchart graphically illustrating a chip bonding method according to an embodiment of the present invention.

The present invention also provides a chip bonding method which, as shown in FIG. 9, includes the steps of:

the first motion stage transferring a set of chips to the chip pickup element and the second motion stage carrying the transfer carrier to the chip pickup element;

the chip pickup element picking up the chips from the first motion stage and causing temporary retention of the chips on the transfer carrier;

the second motion stage moving the transfer carrier on which the chips are temporarily retained to the chip adjustment system;

the chip adjustment system adjusting the positions of the chips on the transfer carrier;

the second motion stage transporting the transfer carrier retaining the position-adjusted chips to a substrate; and the bonding stage that supports the substrate causing final bonding of the substrate to the chips on the transfer carrier.

The chip bonding method according to the present invention will be described below with reference to a particular embodiment.

As shown in FIG. 2, under the control of the control system 500, the first robotic arm 010 picks up a support carrier 130 from the carrier cassette 000 and places it on the first motion stage 100. The first motion stage 110 moves so that a target chip 140n is right under the flipping arm 160. The target chip 140n is lifted up by the jack mechanism 120 and the target chip 140n is then picked up and turned by 180 degrees by the flipping arm 160. After that, the flipping arm 160 carries and moves the target chip 140n in the Z-direction to a position where it is transferred by suction onto the transfer carrier 170 for temporary retention. The target chip 140n may be transferred and retained by suction in any suitable form such as vacuum suction or electrostatic suction. At this point, the mark 150n is located under the target chip 140n.

Figure 3:
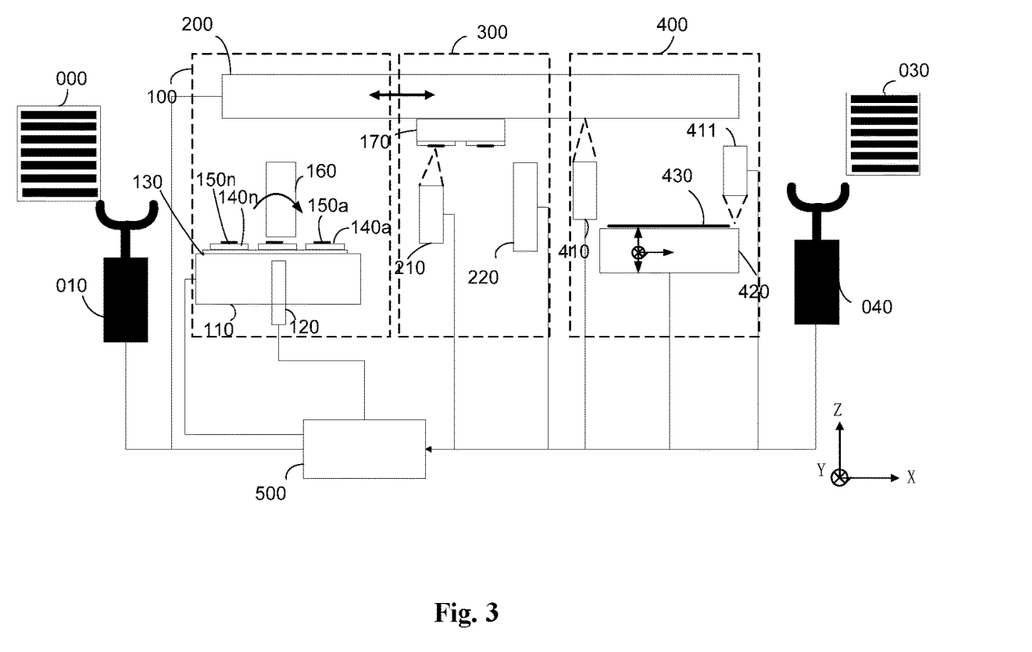

This process is repeated until all the chips on the support carrier are transferred onto the transfer carrier 170, as shown in FIG. 3. The second motion stage 200 transports the transfer carrier 170 into the alignment measuring region for the alignment system 210, where the alignment system 210 measures the positions of the target chips on the transfer carrier 170, and based on this measurement, the motion stage 200 moves the transfer carrier 170 to above the fine tuning mechanism 220, followed by a position adjustment on the target chip carried out under the control of the control system 500 and under the cooperation of the fine tuning mechanism 220 and the second motion stage 200.

Figure 4:
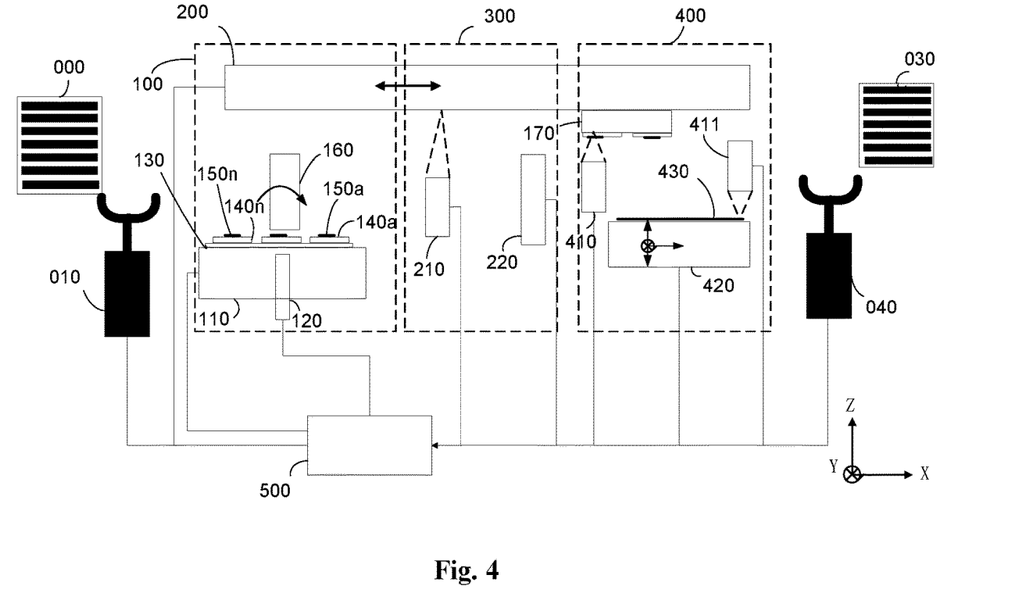

As shown in FIG. 4, subsequent to the completion of the position adjustment on the target chips on the transfer carrier 170, the second motion stage 200 transports the transfer carrier 170 to right above the substrate 430 and the bonding stage 420, based on measurement data from the calibration systems 410 and 411, moves in multiple degrees of freedom to align the transfer carrier 170 with the substrate 430. Subsequently, the chips on the transfer carrier 170 are bonded to the substrate 430 by an organic adhesive that can be stripped away. At this point, the mark 150n is located between the target chip 140n and the substrate.

Afterwards, the second motion stage 200 transports the transfer carrier 170 back to the separation section 100, and the above steps are repeated until all the target chips are transferred from the support carrier 130 onto the substrate 430. With this done, the second robotic arm 040 picks up the substrate 430 and places it into the substrate cassette 030.

Based on the process requirements, the layout of target chips on the transfer carrier may be properly designed based on the size, pitch and number of the chips and margins of the transfer carrier. According to the present invention, comprehensive optimization and configuration is possible according to the throughput and cost requirements through incorporating multiple identical instances of the alignment system 210 and multiple identical instances of the fine tuning mechanism 220, which can measure and adjust the positions of multiple target chips on the transfer carrier in parallel at the same time.

In summary, the chip bonding device and method of the present invention allow greatly improved flip-chip bonding efficiency by bonding chips in batches onto the substrate using the transfer carrier capable of temporary retention of the chips and the chip adjustment system capable of accurate chip position adjustment for the transfer carrier. Picking up and bonding chips in batches according to the present invention balances the times required respectively for chip picking up, fine chip position tuning and chip bonding, thereby ensuring high bonding accuracy of the bonding device while increasing the throughput.

The description presented above is merely that of a few preferred embodiments of the present invention and does not limit the scope thereof in any sense. Any and all changes and modifications made by those of ordinary skill in the art based on the above teachings fall within the scope as defined in the appended claims.

It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A chip bonding device, comprising a first motion stage, a second motion stage, a chip pickup element, a transfer carrier, a chip adjustment system, a bonding stage and a control system, wherein:
   the first motion stage is configured to support a set of chips and transport the set of chips to the chip pickup element;
   the transfer carrier is configured for temporary retention of the chips picked up by the chip pickup element from the first motion stage;
   the chip adjustment system is configured to adjust positions of the chips on the transfer carrier;
   the bonding stage is configured to support a substrate;
   the second motion stage is configured to transport the transfer carrier to the chip pickup element, and further transport the chip pickup element having the chips temporarily retained thereon to the chip adjustment system, and further transport the chip pickup element having the position-adjusted chips retained thereon to the substrate, so as to finally bond the substrate to the chips on the transfer carrier; and
   wherein each of the first motion stage, the second motion stage, the chip adjustment system and the bonding stage is controlled by the control system and movable in multiple degrees of freedom.

2. The chip bonding device of claim 1, further comprising a calibration system, wherein the chips are provided with chip marks and the substrate is provided with substrate marks, wherein the calibration system is configured to detect the chip marks and the substrate marks, and wherein the control system is configured to adjust a position of the bonding stage based on the detection by the calibration system so that the chip marks are aligned with the substrate marks.

3. The chip bonding device of claim 1, wherein the chip pickup element comprises a flipping arm configured to pick up the chips from the first motion stage, flip the chips and achieve the temporary retention of the chips on the transfer carrier.

4. The chip bonding device of claim 3, wherein the flipping arm comprises: a first motion mechanism; a motor for driving the first motion mechanism to flip the chips; a connecting member that connects the motor to the first motion mechanism; and a first suction cup connected to the first motion mechanism and configured to retain a target chip by suction.

5. The chip bonding device of claim 1, wherein the bonding stage is disposed under the substrate and is configured to move the substrate upward so as to bond the substrate to the chips on the transfer carrier.

6. The chip bonding device of claim 1, wherein the chip adjustment system comprises an alignment system and a fine tuning system, which are configured to measure and adjust the positions of the chips on the transfer carrier.

7. The chip bonding device of claim 6, wherein the fine tuning system comprises: a second motion mechanism; a second suction cup connected to the second motion mechanism and configured to retain a target chip by suction; and a support mechanism configured to support the second motion mechanism, and wherein
   during an adjustment of a position of the target chip on the transfer carrier by the chip adjustment system, the target chip on the transfer carrier is sucked by the second suction cup, and after the transfer carrier is moved to a position suitable for temporary retention of the target chip by the second motion stage based on a measurement performed by the alignment system, the target chip is transferred again to the transfer carrier by the second suction cup.

8. The chip bonding device of claim 7, wherein after the target chip is transferred again to the transfer carrier by the second suction cup, the second motion stage delivers the transfer carrier into an alignment measuring region for the alignment system for position verification, and if the alignment system determines that the target chip is not positioned at a predetermined position, the position of the target chip on the transfer carrier is repeatedly adjusted until the target chip is positioned at the predetermined position.

9. The chip bonding device of claim 6, wherein the alignment system comprises a broadband light source, an illumination lens group, a beam splitting prism, a front imaging lens group, a rear imaging lens group and an image sensor; and wherein
   a measuring light beam from the broadband light source propagates successively through the illumination lens group, the beam splitting prism and the front imaging lens group and is incident onto a chip mark of a target chip, and the reflected beam from the chip mark propagates successively through the front imaging lens group, the beam splitting prism and the rear imaging lens group and forms an image of the chip mark on the image sensor, followed by outputting of an image by the image sensor, which is processed to determine the position of the target chip on the transfer carrier.

10. The chip bonding device of claim 1, further comprising a jack mechanism that is connected to the first motion stage and is configured to lift the chips so that the chip pickup element is able to pick up the chips from the first motion stage.

11. The chip bonding device of claim 10, wherein the jack mechanism comprises: a pin; a suction retainer; and a horizontal motion mechanism attached to a bottom of the suction retainer, the suction retainer configured for retention of the chip by suction, the pin configured to lift the chips, the horizontal motion mechanism configured to horizontally transport the pin and the suction retainer to move the pin to a predetermined position.

12. The chip bonding device of claim 1, further comprising a carrier cassette and a first robotic arm, the carrier cassette disposed in vicinity of the first motion stage and configured to hold a support carrier that carries the set of chips, the first robotic arm configured to, under the control of the control system, pick up the support carrier and transport the support carrier to the first motion stage.

13. The chip bonding device of claim 1, further comprising a substrate cassette and a second robotic arm, the substrate cassette disposed in vicinity of the bonding stage and configured to store the substrate that have undergone the chip bonding, the second robotic arm configured to, under the control of the control system, pick up the substrate and place the substrate into the substrate cassette.

14. A chip bonding method, comprising the steps of:
- transporting a set of chips to a chip pickup element by a first motion stage and moving a transfer carrier to the chip pickup element by a second motion stage;
- picking up the chips from the first motion stage and temporarily retaining the chips on the transfer carrier by the chip pickup element;
- transporting the transfer carrier on which the chips are temporarily retained to a chip adjustment system by the second motion stage;
- adjusting positions of the chips on the transfer carrier by the chip adjustment system;
- transporting the transfer carrier retaining the position-adjusted chips to a substrate by the second motion stage; and
- finally bonding the substrate to the chips on the transfer carrier by the bonding stage that supports the substrate.

15. The chip bonding method of claim 14, further comprising, prior to transporting the set of chips to the chip pickup element by the first motion stage, picking up a support carrier on which the set of chips are carried from a carrier cassette and placing the support carrier on the first motion stage by a first robotic arm.

16. The chip bonding method of claim 15, further comprising repeating the steps until all of the chips on the support carrier are bonded to the substrate.

17. The chip bonding method of claim 14, further comprising, subsequent to the final bonding of the substrate to the chips on the transfer carrier, picking up the substrate to which the chips have been bonded and placing the substrate into a substrate cassette by a second robotic arm.

* * * * *